(12) United States Patent
Choi

(10) Patent No.: US 7,880,220 B2
(45) Date of Patent: *Feb. 1, 2011

(54) NON-VOLATILE MEMORY DEVICE AND FABRICATION METHOD OF NON-VOLATILE MEMORY DEVICE AND MEMORY APPARATUS INCLUDING NON-VOLATILE MEMORY DEVICE

(75) Inventor: Byoung Deog Choi, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 189 days.

This patent is subject to a terminal disclaimer.

(21) Appl. No.: 11/777,613

(22) Filed: Jul. 13, 2007

(65) Prior Publication Data

US 2008/0116460 A1 May 22, 2008

(30) Foreign Application Priority Data

Nov. 20, 2006 (KR) ...................... 10-2006-0114585

(51) Int. Cl.
*H01L 29/66* (2006.01)
(52) U.S. Cl. ............................... 257/325; 257/E29.309
(58) Field of Classification Search ................. 257/314, 257/315, 64, 66, 70, 324, 325, 410
See application file for complete search history.

(56) References Cited

U.S. PATENT DOCUMENTS

| 6,747,310 | B2 * | 6/2004 | Fan et al. .................... 257/320 |
|---|---|---|---|
| 7,122,488 | B2 * | 10/2006 | Joshi et al. ................... 438/788 |
| 7,189,999 | B2 * | 3/2007 | Yamazaki et al. ............. 257/72 |
| 2004/0021805 | A1 * | 2/2004 | Nagata et al. .................. 349/43 |
| 2004/0053468 | A1 * | 3/2004 | Dong et al. .................. 438/261 |
| 2005/0272184 | A1 * | 12/2005 | Hiramatsu et al. .......... 438/149 |
| 2006/0027882 | A1 * | 2/2006 | Mokhlesi ..................... 257/410 |
| 2007/0054505 | A1 * | 3/2007 | Antonelli et al. ............ 438/789 |
| 2008/0121887 | A1 * | 5/2008 | Choi et al. ..................... 257/66 |
| 2008/0121888 | A1 * | 5/2008 | Choi et al. ..................... 257/66 |

FOREIGN PATENT DOCUMENTS

| KR | 2002-1021 | 1/2002 |
|---|---|---|
| KR | 2002-3761 | 1/2002 |
| KR | 2005-56067 | 6/2005 |
| KR | 10-719680 | 5/2007 |

OTHER PUBLICATIONS

Notice of Allowance issued in corresponding Korean Patent Application No. 10-2006-0114585 dated Apr. 30, 2008.

* cited by examiner

*Primary Examiner*—Minh-Loan T Tran
*Assistant Examiner*—Vongsavanh Sengdara
(74) *Attorney, Agent, or Firm*—Stein McEwen, LLP

(57) ABSTRACT

A non-volatile memory device is capable of reducing an excessive leakage current due to a rough surface of a polysilicon and realizing improved blocking function with an oxide film that is thinner by forming a first oxide film and a second oxide film including a silicon oxy-nitride ($SiO_xN_y$) layer using nitrous oxide ($N_2O$) plasma. A fabricating method and a memory apparatus of the non-volatile memory device are also discussed.

16 Claims, 7 Drawing Sheets

NON-VOLATILE MEMORY DEVICE AND FABRICATION METHOD OF NON-VOLATILE MEMORY DEVICE AND MEMORY APPARATUS INCLUDING NON-VOLATILE MEMORY DEVICE

CROSS-REFERENCE TO RELATED APPLICATION

This application claims the benefit of Korean Application No. 2006-114585, filed Nov. 20, 2006 in the Korean Intellectual Property Office, the disclosure of which is incorporated herein by reference.

BACKGROUND OF THE INVENTION

1. Field of the Invention

Aspects of the present invention relate to a non-volatile memory device and a fabrication method of the non-volatile memory device. More specifically, aspects of the present invention relate to a non-volatile memory device formed on a substrate, such as a glass substrate, and a method of fabricating the non-volatile memory device, and a memory apparatus including the non-volatile memory device.

2. Description of the Related Art

Generally, a non-volatile memory device may be classified as a floating-gate memory device and a charge-trapping memory device. The floating-gate memory device is a device for maintaining data by using a potential well. The charge-trapping memory device is a device for maintaining data by trapping charges in a trap region inside a nitride film or a trap region present in an interface between the nitride film and an insulator.

A representative structure of the charge-trapping memory device is a Silicon-Oxide-Nitride-Oxide-Silicon (SONOS) structure. Typically, the SONOS structure may include a sequential stack of a semiconductor substrate, an ONO structure, and a gate electrode. The ONO structure may include a sequential stack of a tunneling oxide film, a nitride film, and a blocking oxide film. The tunneling oxide film may enable electrons to tunnel into a trap region inside the nitride film or a trap region of an interface of the nitride film. The blocking oxide film may block charges from moving between the nitride film and the gate electrode. The trap region may store charges. Source/drain regions may be provided on the semiconductor substrate on either side of the above stack.

A recent trend has been the formation of a non-volatile memory device on a glass substrate. Such a device may include a sequential stack of the glass substrate, the ONO structure, and the gate electrode. The glass substrate may include a protective layer (e.g., a buffer oxide film) thereon to protect the glass substrate. A polysilicon layer may be provided on the protective layer. Source/drain regions may be provided on the polysilicon layer on either side of the above stack.

Forming the polysilicon layer may include crystallizing an amorphous polysilicon layer (e.g., by irradiating the amorphous polysilicon layer with a laser). Thus, surfaces of the polysilicon layer may be rough and non-uniform, which may result in generation of a large leakage current. In other words, a leakage current thereof may be significantly increased due to the roughness and the non-uniformity of the surfaces of the polysilicon layer. Therefore, such a non-volatile memory device may function abnormally during programming/erasing operations.

SUMMARY OF THE INVENTION

Aspects of the present invention are therefore directed to a non-volatile memory device, a fabrication method of the non-volatile memory device, and a memory apparatus including the non-volatile memory device, which substantially overcome one or more of the problems due to the limitations and disadvantages of the related art and/or other problems, limitation, and/or disadvantages.

An aspect of the present invention provides a non-volatile memory device on a substrate, such as a glass substrate, the non-volatile memory device is capable of reducing excessive leakage current due to a rough surface of a polysilicon and realizing improved blocking function with an oxide film that is thinner than that of a related art oxide film by forming a first oxide film and a second oxide film including a silicon oxy-nitride ($SiO_xN_y$) layer using nitrous oxide ($N_2O$) plasma, and a fabricating method of the non-volatile memory device and a memory apparatus including the non-volatile memory device.

The above and/or other features and advantages of aspects of the present invention may be realized by providing a non-volatile memory device including a buffer oxide film, a polysilicon layer on the buffer oxide film, a first insulator including a sequential stack of a silicon oxy-nitride ($SiO_xN_y$) layer and a silicon dioxide ($SiO_2$) layer on the polysilicon layer, a nitride film on the first insulator, a second insulator including a sequential stack of a silicon oxy-nitride ($SiO_xN_y$) layer and a silicon dioxide ($SiO_2$) layer on the nitride film, a gate electrode on the second insulator, and a source/drain by injecting impurity ions into an exposed region of the polysilicon layer.

The above and/or other features and advantages of aspects of the present invention may be realized by providing a method of fabricating a non-volatile memory device, the method including forming a buffer oxide film, forming a polysilicon layer on the buffer oxide film, forming a first insulator including a sequential stack of a silicon oxy-nitride ($SiO_xN_y$) layer and a silicon dioxide ($SiO_2$) layer on the polysilicon layer using nitrous oxide ($N_2O$) plasma, forming a nitride film on the first insulator, forming a second insulator including a sequential stack of a silicon oxy-nitride ($SiO_xN_y$) layer and a silicon dioxide ($SiO_2$) on the nitride film using nitrous oxide ($N_2O$) plasma, forming a gate electrode on the second insulator, and forming a source/drain by injecting impurity ions into an exposed region of the polysilicon layer.

Further, in a non-volatile memory apparatus according to an aspect of the present invention, a field region defining an active region and a word line crossing the active region and the field region are formed. The non-volatile memory apparatus includes a non-volatile memory device formed at a cross region of the word line and the active region. The non-volatile memory device also includes a buffer oxide film, a polysilicon layer on the buffer oxide film, a first insulator including a sequential stack of a silicon oxy-nitride ($SiO_xN_y$) layer and a silicon dioxide ($SiO_2$) layer on the polysilicon layer, a nitride film on the first insulator, a second insulator including a sequential stack of a silicon oxy-nitride ($SiO_xN_y$) layer and a silicon dioxide ($SiO_2$) layer on the nitride film, a gate electrode on the second insulator, and a source/drain by injecting impurity ions into an exposed region of the polysilicon layer.

Further, a flat panel display device according to an aspect of the present invention includes a power source section, a memory section, a program section, a buffer section, and a panel section. The memory section includes the non-volatile memory device. The non-volatile memory device includes a buffer oxide film, a polysilicon layer on the buffer oxide film, a first insulator including a sequential stack of a silicon oxy-nitride ($SiO_xN_y$) layer and a silicon dioxide ($SiO_2$) layer on the polysilicon layer, a nitride film on the first insulator, a second insulator including a sequential stack of a silicon oxy-nitride ($SiO_xN_y$) layer and a silicon dioxide ($SiO_2$) layer on the nitride film, a gate electrode on the second insulator, and a source/drain by injecting impurity ions into an exposed region of the polysilicon layer.

According to an aspect of the present invention, a non-volatile memory device includes a first layer having a change of concentration of a first element relative to a second element through the thickness thereof, a second layer formed on the first layer and having a constant concentration of the first element through the thickness thereof, and a third layer formed on the second layer and having a change of concentration of the first element relative to the second element through the thickness thereof.

According to an aspect of the present invention, a method of fabricating a non-volatile memory device includes forming a first layer having a change of concentration of a first element relative to a second element through the thickness thereof, forming a second layer on the first layer and having a constant concentration of the first element through the thickness thereof, and a third layer formed on the second layer and having a change of concentration of the first element relative to the second element through the thickness thereof.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which.

DETAILED DESCRIPTION OF THE EMBODIMENTS

Figure 1A:
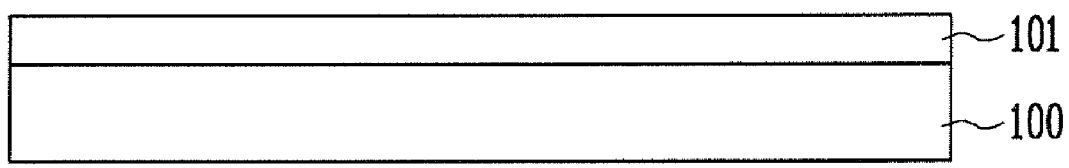
FIG. 1A to FIG. 1H illustrate cross-sectional views of stages in a method of fabricating a non-volatile memory device according to an aspect of the present invention.

Reference will now be made in detail to the aspects of the present invention, examples of which are illustrated in the accompanying drawings, wherein like reference numerals refer to the like elements throughout. The aspects are described below in order to explain the present invention by referring to the figures.

In the figures, the dimensions of layers and regions may be exaggerated for clarity of illustration. It should also be understood that when a layer or element is referred to as being "on" another layer or substrate, the layer or element can be directly on the other layer or substrate, or intervening layers may also be present. Further, it should be understood that when a layer is referred to as being "under" another layer, the layer can be directly under the another layer, or one or more intervening layers may also be present.

In addition, it should also be understood that when a layer is referred to as being "between" two layers, the layer can be between the two layers, or one or more intervening layers may also be present. When one element is connected to another element, the one element may be directly connected to another element, or be indirectly connected to another element via yet another element. Further, it should be understood that various other elements may be omitted or not described in detail for clarity.

Figure 1B:
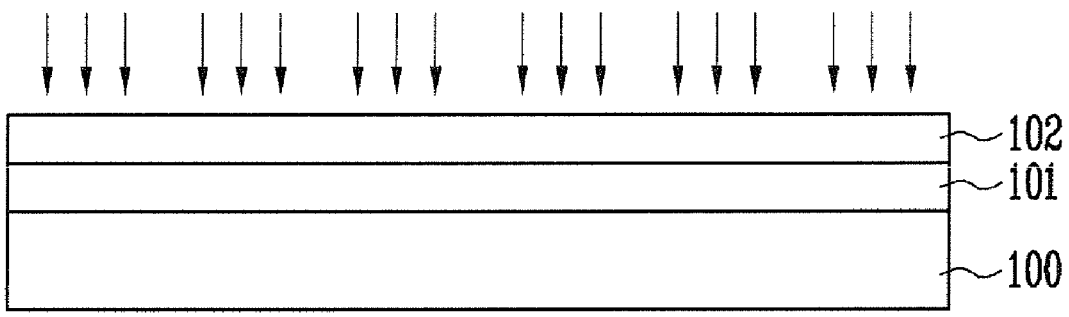
Figure 1C:
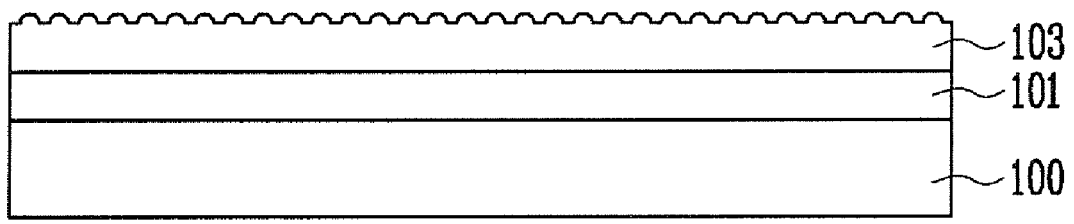
Figure 1D:
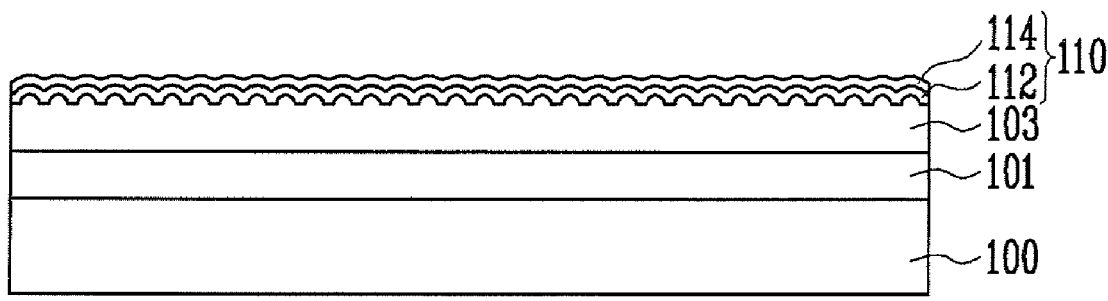
Figure 1E:
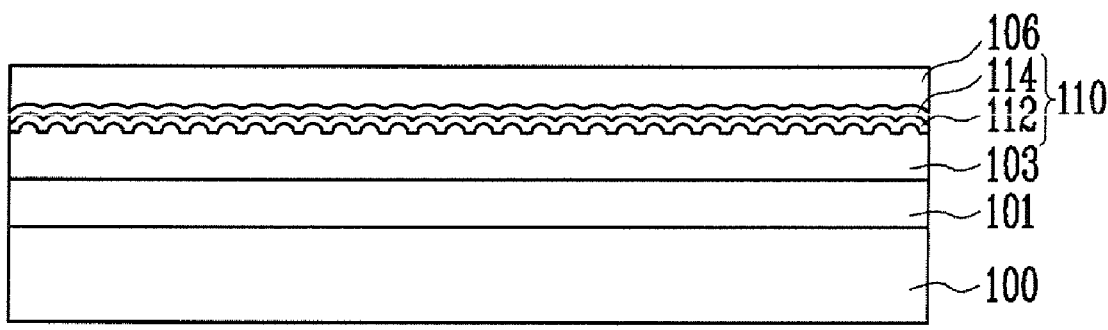
Figure 1F:
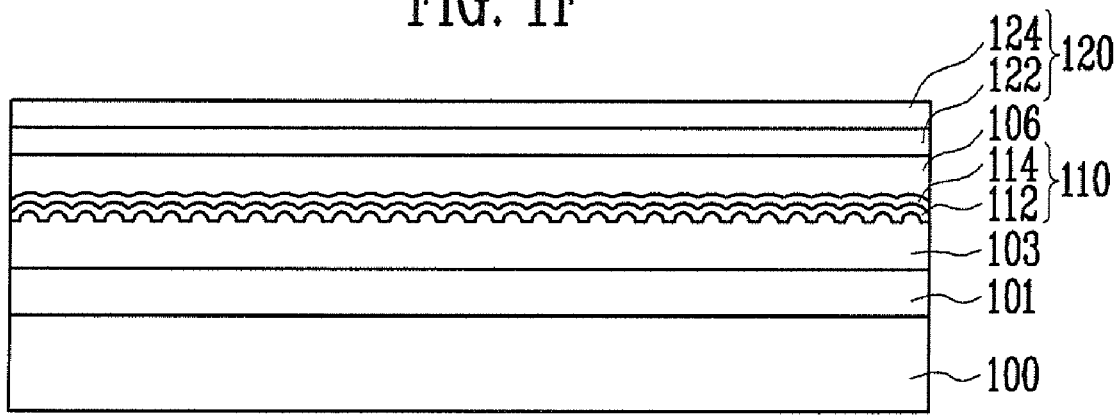
Figure 1G:
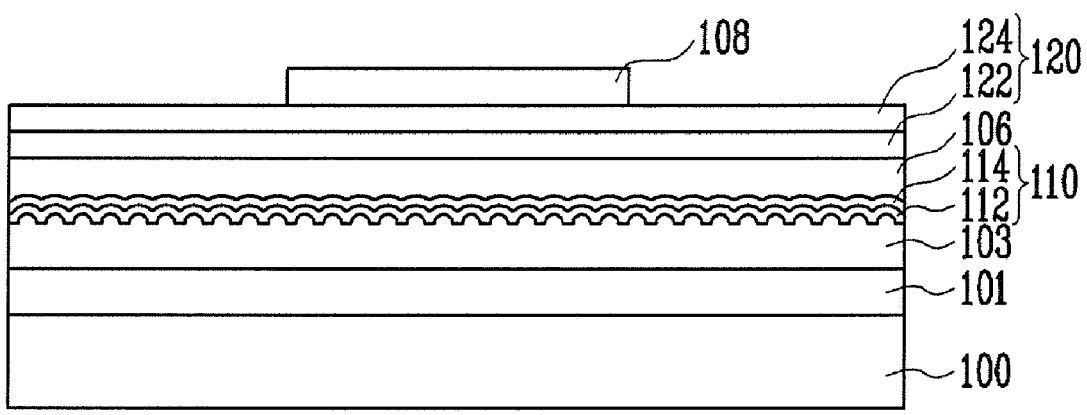
Figure 1H:
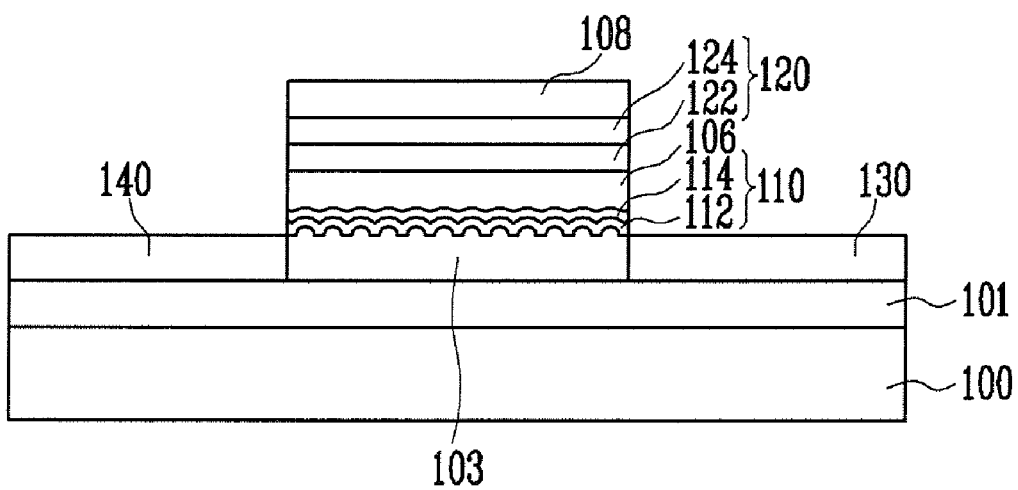

Before describing a method used to form a non-volatile memory device in accordance with an aspect of the present invention, a description of the non-volatile memory device itself will be provided with reference to FIG. 1H, which is a cross-sectional view thereof. As shown in the non-limiting aspect, the non-volatile memory device includes a substrate 100, such as a glass substrate, a buffer oxide film 101, a polysilicon layer 103, a first insulator 110 including a sequential stack of a $SiO_xN_y$ layer 112 and a $SiO_2$ layer 114, a nitride film 106, a second insulator 120 including a sequential stack of a $SiO_xN_y$ layer 122 and a $SiO_2$ layer 124, a gate electrode 108, a source 130, and a drain 140. In the aspect shown, the first insulator 110 may serve as a tunneling oxide film, the nitride film 106 may serve as a trapping film, and the second insulator 120 may serve as a blocking oxide film.

FIG. 1A to FIG. 1H are cross-sectional views of stages in a method of fabricating a non-volatile memory device according to an aspect of the present invention. First, as illustrated in FIG. 1A the buffer oxide film 101 may be deposited (or formed) on the substrate 100, which may be a glass substrate, using a chemical vapor deposition (CVD) process (or technique), for example. The buffer oxide film 101 may be formed sufficiently thick to block impurities between the glass substrate 100 and other structures of the non-volatile memory device to be formed. The buffer oxide film 101 may have a thickness of approximately 3,000 Å (angstrom).

Subsequently, as illustrated in FIG. 1B, an amorphous silicon layer 102 may be deposited (or formed) on the buffer oxide film 101, using a CVD process, for example. The amorphous silicon layer 102 may have a thickness of approximately 500~600 Å. The amorphous silicon layer 102 may be irradiated with a laser beam, as shown in FIG. 1B, to crystallize at least a portion of the amorphous silicon layer 102.

As shown in FIG. 1C, a predetermined thickness of the amorphous silicon layer 102 may be changed into the polysilicon layer 103 as a result of the irradiation. For sake of convenience, the result of the irradiation will be illustrated using only the polysilicon layer 103 in the aspect shown. However, it should be understood that in some aspects, some parts of the amorphous silicon layer 102 may remain. That is, both the amorphous and polysilicon parts may be present in the polysilicon layer 103. In various aspects, due to the processing (or irradiation) of the amorphous silicon layer 102, an upper surface of the polysilicon layer 103 formed through irradiation may not be uniform (i.e., may be rough).

Next, as shown in FIG. 1D, the first insulator 110 may be sequentially formed on the polysilicon layer 103. The upper surface of the polysilicon layer 103 may be rough at this time, as represented in FIG. 1D. In various aspects, the first insulator 110 may be provided (or formed) in an inductively coupled plasma CVD apparatus by oxidation using a nitrous oxide ($N_2O$) plasma, for example. In various aspects, the operation may be performed at a low temperature, such as at temperatures of about 500° C. or less, though not required. In other aspects, higher temperatures are within the scope of the invention. The first insulator 110 may include a sequential stack of a silicon oxy-nitride layer ($SiO_xN_y$) and a silicon dioxide layer ($SiO_2$) formed through the above process.

In various aspects, the $SiO_xN_y$ layer 112 may have a thickness of approximately 10 to 20 Å, such as approximately 15 Å. The $SiO_2$ layer 114 may have a thickness of approximately 10 to 25 Å, such as approximately 15 Å. In various aspects, the subscripts X and Y are any number whose sum does not exceed 2.

In the non-limiting aspect shown, the $SiO_xN_y$ layer 112 and the $SiO_2$ layer 114 of the first insulator 110 may be sequentially formed using the same apparatus, and a concentration of nitrogen that is included in the first insulator 110 on the polysilicon layer 103 may be varied and/or reduced during processing. Thus, the concentration of nitrogen in the first insulator 110 may decrease from a high concentration on a surface of the polysilicon layer 103 to a low concentration on the upper surface of the first insulator 110 by varying the concentration of the nitrogen, in the $N_2O$ plasma, for example, while carrying out the oxidation process (or the CVD process thereof). In particular, the nitrogen in the $N_2O$ plasma may be reduced to zero at some point in the process, in accordance with obtaining a desired thickness of the $SiO_xN_y$ layer 112. In other words, the $SiO_xN_y$ layer 112 formed on the surface of the polysilicon layer 103 includes a high concentration of nitrogen, while the $SiO_2$ layer 114 formed on the $SiO_xN_y$ layer 112 has little or no nitrogen. In various aspects, the change in the concentration of the nitrogen in the $SiO_xN_y$ layer 112 or the first insulator 110 may be gradual, abrupt, or combinations thereof. In other aspects, the concentration of nitrogen need not continually decrease but may decrease then increase or vice versa. In other aspects, such increase or decrease in the concentration of nitrogen may be repeated.

A concentration of nitrogen may be large on the surface of the polysilicon layer 103, to thereby form a layer of $Si_3N_4$ at the surface of the polysilicon layer 103 when a very rapid rate of formation occurs in the early stages of the oxidation process using the $N_2O$ plasma. After a predetermined time, the concentration of nitrogen in the $N_2O$ plasma may be reduced by substituting oxygen for the nitrogen, for example, while the first insulator 110 grows.

Accordingly, in the non-limiting aspect shown, the first insulator 110 may include the $SiO_xN_y$ layer 112 and the $SiO_2$ layer 114, based (or dependent) on the nitrogen concentration. In various aspects, when the first insulator 110 is deposited in accordance with the above process to a thickness of about 30 Å over the polysilicon layer 103, part of the first insulator 110 thinner than (or less than) 15 Å may become the $SiO_xN_y$ layer 112, while part of the first insulator 110 thicker than (or greater than) 15 Å may become the $SiO_2$ layer 114 due to the concentration of nitrogen being nearly zero at a thickness of 15 Å or greater relative to the surface of the polysilicon layer 103. While it may be most efficient to form the $SiO_xN_y$ layer 112 and the $SiO_2$ layer 114 in the same apparatus and from the same insulation material or layer, the $SiO_xN_y$ and $SiO_2$ layers 112 and 114 may be made from different materials or layers and/or in different apparatuses or processes. Further, while control of the nitrogen content or concentration may make the $SiO_xN_y$ and $SiO_2$ layers 112 and 114 clearly distinct, these layers may also have a gradient of nitrogen therethrough, such that the layers are non-distinct and/or more gradually changing in concentration of nitrogen rather than abruptly at an interface thereof.

Programming/erasing operations (i.e., programming and/or erasing) of the non-volatile memory device on the glass substrate 100 having the $SiO_xN_y$ layer 112 and the $SiO_2$ layer 114 thereon, formed as above, may function normally (or desired) since a leakage current caused by the surface characteristic of the related are polysilicon layer may be reduced or eliminated.

Subsequently, as shown in FIG. 1E, the nitride film 106 may be formed on the first insulator 110 using an inductively coupled plasma CVD apparatus, for example. The nitride film 106 may be formed to a thickness of approximately 50 to 350 Å. In an aspect of the present invention, the thickness of the nitride film 106 may be approximately 150 Å. The nitride film 106 may be formed using an ammonia ($NH_3$) gas or a nitrogen ($N_2$) gas. In various aspects, the non-volatile memory device, the nitride film 106 stores information or data by trapping charges in a trap region inside the nitride film 106, in an interfacial trap region between the first insulator 110 and the nitride film 106, or in an interfacial trap region between the nitride film 106 and the second insulator 120.

Referring to FIG. 1F, in various aspects, the second insulator 120 may be formed on the nitride film 106 using an inductively coupled plasma CVD apparatus, for example. The second insulator 120 may be formed in an inductively coupled plasma CVD apparatus by oxidation using the nitrous oxide ($N_2O$) plasma, for example. In various aspects, the operation may be performed at a low temperature, such as at temperatures of about 500° C. or less, though not required. In other aspects, higher temperatures are within the scope of the invention. The second insulator 120 may include a sequential stack of a silicon oxy-nitride layer ($SiO_xN_y$) 122 and a silicon dioxide layer ($SiO_2$) 124, which may be formed by the process identical to that of the first insulator 110, though not required. In other aspects, a different process may be used.

In the aspect shown, the $SiO_xN_y$ layer 122 and the $SiO_2$ layer 124 of the second insulator 120 may be sequentially formed using the same or a different apparatus, and a concentration of nitrogen included in the second insulator 120 formed on the nitride film 106 may be varied and/or reduced during processing. Thus, the concentration of nitrogen in the second insulator 120 may decrease from a high concentration on a surface of the nitride film 106 to a low concentration on the upper surface of the second insulator 120 by varying the concentration of the nitrogen, in the $N_2O$ plasma for example, while carrying out the oxidation process (or the CVD process thereof). In particular, the nitrogen in the $N_2O$ plasma may be reduced to zero at some point in the process, in accordance with obtaining a desired thickness of the $SiO_xN_y$ layer 122. In other words, the $SiO_xN_y$ layer 122 formed on the surface of the nitride film 106 includes a high concentration of nitrogen, while the $SiO_2$ 124 layer formed on the $SiO_xN_y$ layer 122 has little or no nitrogen. In various aspects, the change in the concentration of the nitrogen in the $SiO_xN_y$ layer 122 or the second insulator 120 may be gradual, abrupt, or combinations thereof. In other aspects, the concentration of nitrogen need not continually decrease but may decrease then increase or vice versa. In other aspects, such increase or decrease in the concentration of nitrogen may be repeated.

In the non-limiting aspect shown, the $SiO_xN_y$ layer 122 on the surface of the nitride film 106 is formed to approximately 50 Å in thickness due to the reformation of the surface caused by the plasma effect of the substrate 100. Since the coupling in the nitride layer 106 (for example, a silicon nitride layer) is not as dense as compared to that of the substrate 100 and can be easily reacted by coupling with oxygen due to plasma deposition, the nitride film 106 can be reformed deeper as compared to that of the substrate 100. Therefore, nitrogen of high density can be included in the thin film (or the second insulator 120). The $SiO_2$ layer 124 on the $SiO_xN_y$ layer 122 can be formed to a thickness of approximately 30 Å and the $SiO_2$ layer 124 and includes only (or substantially only) silicon, oxygen, and a minimal amount of nitrogen atoms.

The $SiO_xN_y$ layer 122 and The $SiO_2$ layer 124 of the second insulator 120 function as blocking oxide films by blocking movement of charges between a gate electrode 108 and the nitride film 106 having a charge trap region in the non-volatile memory device formed on the glass substrate 100.

Subsequently, as shown in FIG. 1G, the gate electrode 108 may be formed by depositing and patterning a metal on the second insulator 120, followed by carrying out a lithographic and/or an etching process.

As shown in FIG. 1H, a source 130 and a drain 140 may be formed by carrying out the lithographic and/or the etching process to expose a portion of the polysilicon layer 103, and injecting impurity ions into the exposed polysilicon layer 103.

Figure 2A:
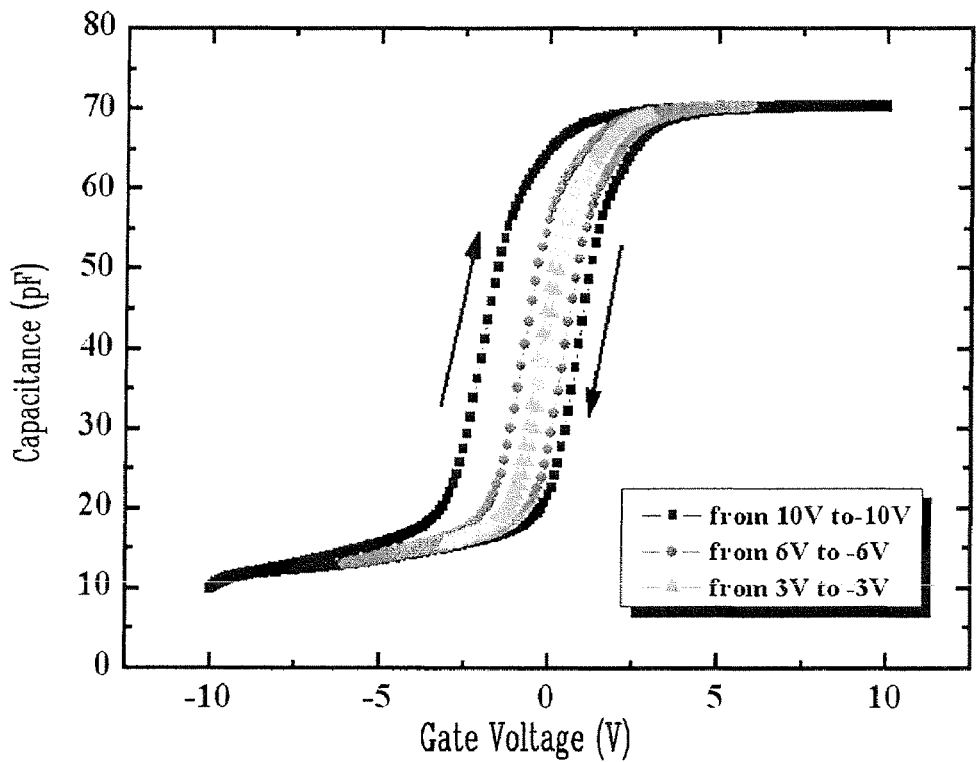
FIG. 2A is a diagram showing a C-V characteristic of a non-volatile memory device according to an aspect of the present invention.
Figure 2B:
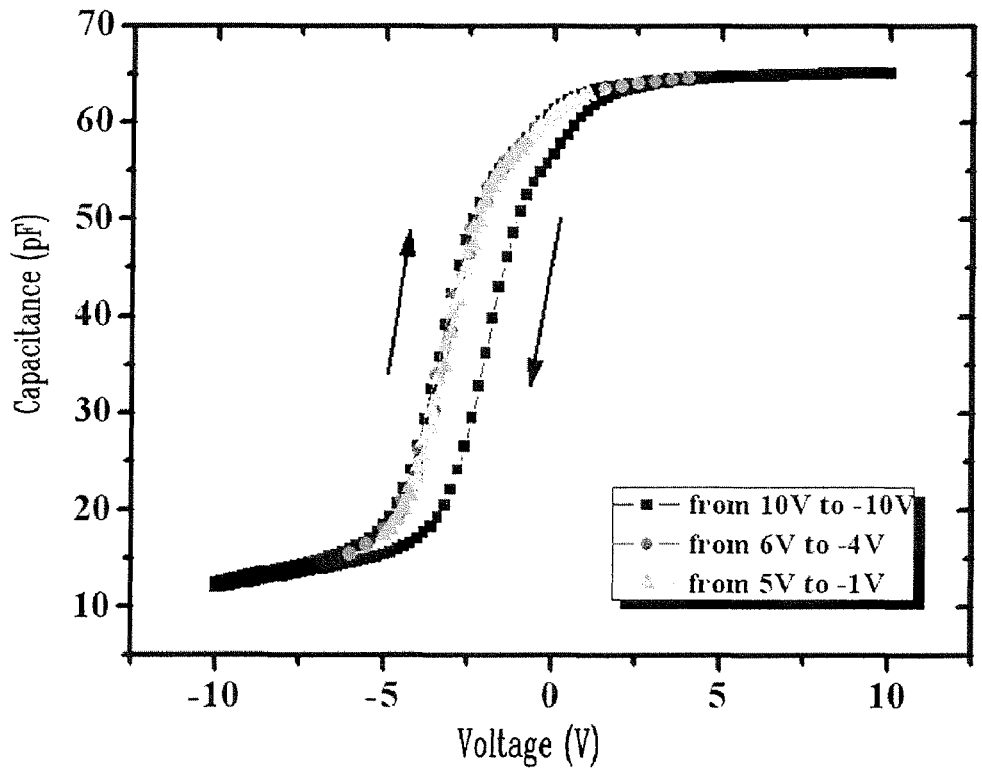
FIG. 2B is a diagram showing a C-V characteristic of a related art non-volatile memory device.

FIG. 2A illustrates a diagram showing a C-V (capacitance-voltage) characteristics of the non-volatile memory according to an aspect of the present invention. FIG. 2B illustrates a diagram showing a C-V characteristics of a related art non-volatile memory device. Referring to FIGS. 2A and 2B, the C-V electrical characteristics of aspects of the present invention indicate that the change width of a flat band voltage is increased by more than 2 V in spite of the same thickness thereof, as compared to that of the related art non-volatile memory device in which the blocking oxide film is only formed of an $SiO_2$ layer.

In the non-limiting aspect shown, when the $SiO_xN_y$ layer 122 and the $SiO_2$ layer 124 of the second insulator 120 function as blocking oxide films by blocking movement of charges between the nitride films 106 having the charge trap region and the gate electrode 108 in the non-volatile memory device formed on a glass substrate 100 as shown in the C-V electrical characteristics of FIG. 2A, the non-volatile memory device has a wider flat band voltage change width (or a wider C-V hysteresis characteristics) in spite of having the same thickness thereof as compared with the related art non-volatile memory device having the blocking oxide film of only with the $SiO_2$ layer. FIG. 2B shows a C-V characteristic of the related art non-volatile memory device.

As shown, since the dielectric constant of the $SiO_xN_y$ layer 122 and the $SiO_2$ layer 124 of the second insulator 120 is approximately 4.6, while the dielectric constant of the $SiO_2$ layer of the second insulator according to the related art shown in FIG. 2B is approximately 3.9, the dielectric constant of the $SiO_xN_y$ layer 122 and the $SiO_2$ layer 124 of the second insulator 120 has a higher dielectric constant. Therefore, even if the energy wall (or an energy barrier) is smaller than 9 eV, the thinner thin film (the second insulator 120) can form a better or a higher value blocking film or augment the blocking oxide film.

Further, since the stacking structure of the $SiO_xN_y$ layer 122 and the $SiO_2$ layer 124 is naturally (or smoothly) formed by a plasma oxidation method, the defect between interfaces is reduced. Therefore, when charges are captured in and/or around the nitride film layer 106, movement of the charges toward a gate (e.g., 108) is firmly blocked through the stacking structure.

In various aspects, the non-volatile memory apparatus can be realized using the non-volatile memory device discussed in reference to FIG. 1H.

In various aspects, the supply of nitrogen to the various layers is by $N_2O$ plasma, $NH_3$ gas, and/or $N_2$ gas. In other aspects, other elements, such as carbon for carbides, and aluminum for aluminides, may be used, instead of or along with nitrogen. In various aspects, although the $SiO_xN_y$ layer 122 of the second insulator 120 is shown as being formed between the $SiO_2$ layer 124 and the nitride layer 106, in other aspects, the $SiO_xN_y$ layer 122 may be formed between the $SiO_2$ layer 124 and the gate 108. In various aspects, similar rearrangement is obtained in the first insulator 110. In various aspects, a plurality of $SiO_xN_y$ layers 112, 122 may be formed in the respective first and second insulators 110, 120.

Non-volatile memory devices occupy an important position in industry together with a DRAM (Dynamic Random Access Memory) and a SRAM (Static Random Access Memory). The non-volatile memory device does not lose the memorized (or stored) information even when a power source is interrupted (or turned off) as compared with that of a volatile RAM (Random Access Memory) which only temporarily memorize or store the data.

Among the different types of non-volatile memory devices, an EEPROM (Electrically Erasable and Programmable Read Only Memory) can electrically erase a program of data and can easily correct the data, but with the data to be stored by way of a system, the need for the system is stronger in the EEPROM.

The different types of non-volatile memory devices that are capable of electrically reading and writing digital data are classified as a byte erasable memory device capable of performing erasing and reading in units of cells and a flash memory device capable of erasing data in units of blocks of more than a few tens to a few hundreds of bytes and recording in units of a byte.

As the byte erasable memory device is able to be selectively erased and programmed, the byte erasable memory device is easy to use and has advantages in various applications. However, since the byte erasable memory device needs two transistor cells, a chip thereof is large and expensive. In comparison, the flash memory device can be programmed in units of a bit but is erasable in entire bit or block units.

In various aspects, the flash memory device has a memory cell that includes one transistor to reduce the cell area. The flash memory device is a non-volatile memory which is not erased even when a power source thereof is turned off.

Currently, the two most common structures of the flash memory is a NOR type structure in which cells are disposed in parallel between a bit line and a ground and a NAND type structure in which cells are disposed in series.

Figure 3A:
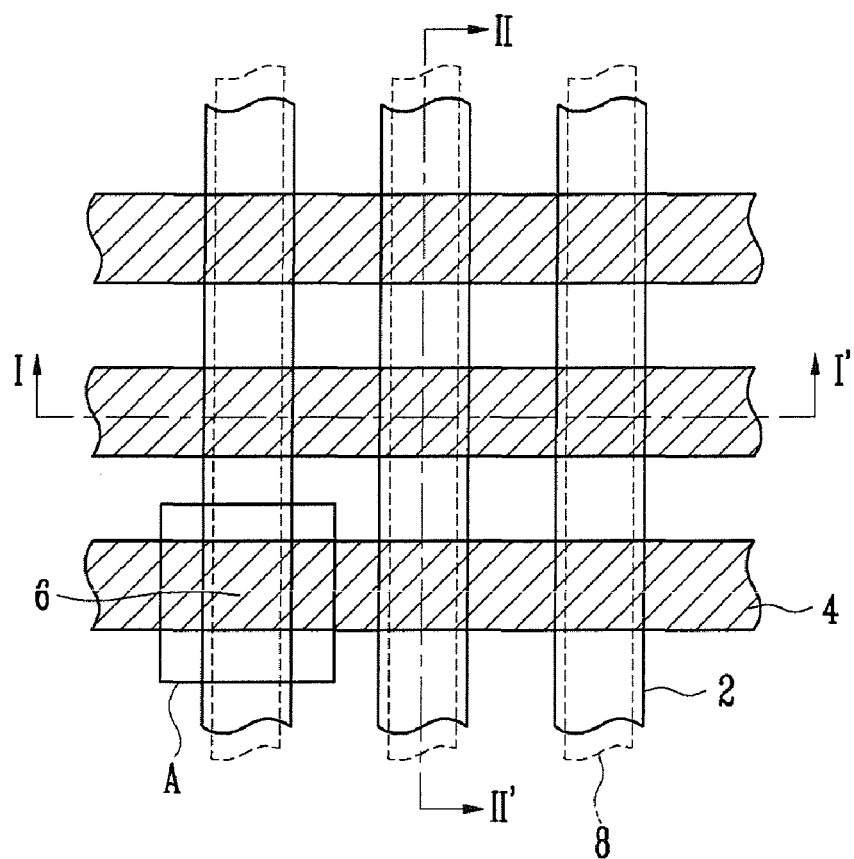
FIG. 3A is a plan view showing a NAND type non-volatile memory device according to an aspect of the present invention.
Figure 3B:
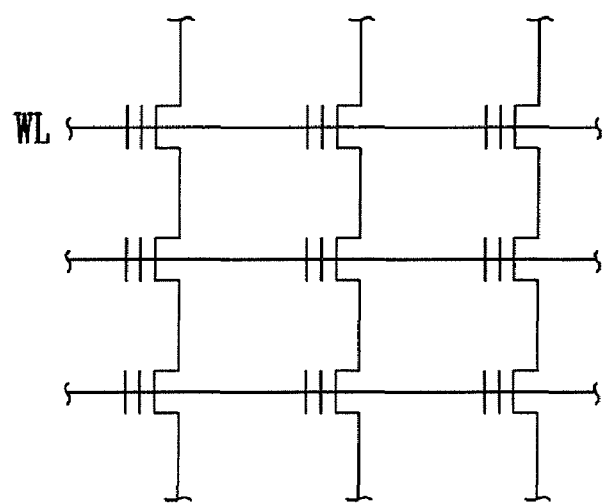
FIG. 3B is an equivalent circuit diagram of FIG. 3A.

FIG. 3A is a plan view showing a non-volatile memory cell having the NAND type structure according to an aspect of the present invention. FIG. 3B is an equivalent circuit diagram of FIG. 3A. Referring to FIG. 3A, a field region defining an active region 2 is formed in the non-volatile memory device. A word line 4 crossing the active region 2 and the field region is formed thereon. A region in which the word line 4 crosses the active region 2 becomes a memory device (i.e., a gate electrode 6 of a transistor). A bit line 8 is formed vertically (or substantially perpendicularly) to the word line 4. The reference numeral A represents a cell, which is a unit of one memory information.

In various aspects, the cell A is implemented by the non-volatile memory device as described with reference to FIGS. 1A to 1H.

Figure 4A:
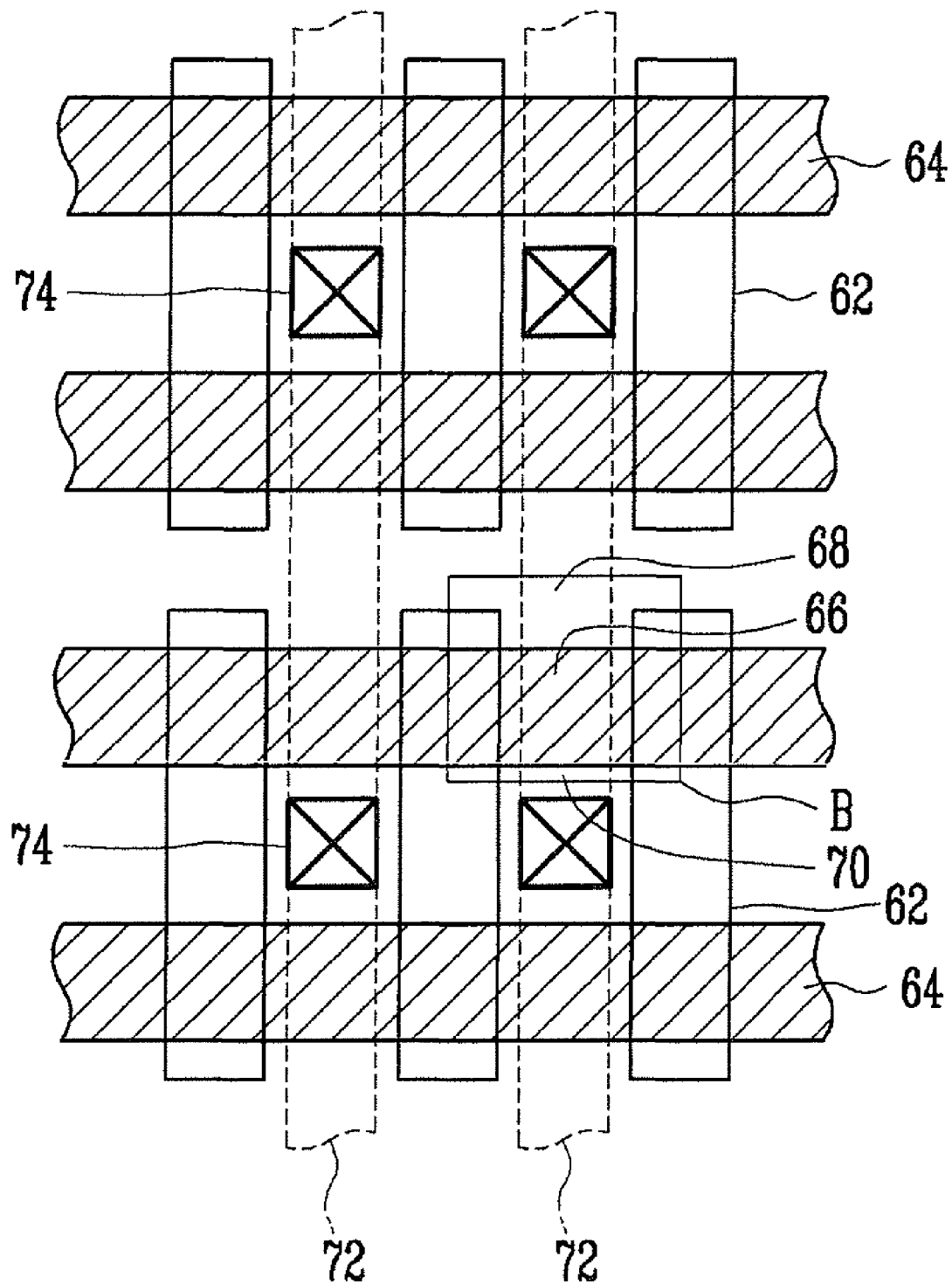
FIG. 4A is a plan view showing a NOR type non-volatile memory device according to an aspect of the present invention.
Figure 4B:
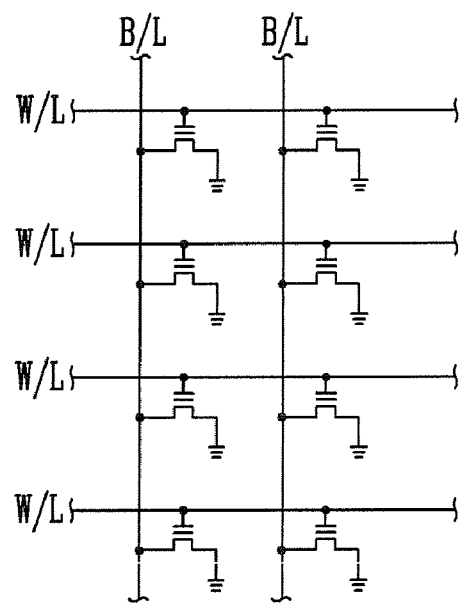
FIG. 4B is an equivalent circuit diagram of FIG. 4A.

FIG. 4A is a plan view representing a non-volatile memory cell having a NOR type structure according to an aspect of the present invention. FIG. 4B is an equivalent circuit diagram of FIG. 4A. Referring to FIG. 4A, a field region 62 defining an active region is formed in the non-volatile memory device. A word line 64 crossing the active region and the field region 62 is formed thereon. A region in which the word line 64 crosses the active region becomes a memory device (i.e., a gate electrode 66 of a transistor). The active regions on both side surfaces of the gate electrode 66 become a source region 68 and a drain region 70 by ion-implanting of impurities. A contact connected to a bit line 72 formed vertically (or substantially perpendicularly) to the word line 64 is formed in the drain region 70. The reference numeral B represents a cell, which is a unit of one memory information.

In various aspects, the cell B is implemented by the non-volatile memory device as described with reference to FIGS. 1A to 1H.

Functionally, the random reading speed of the NAND type flash memory device is slower than that of the NOR type flash memory device and is limited in that data of a plurality of cells connected in series to the NAND type cell array is required to be written and erased as a single group.

On the other hand, the NAND type flash has the advantage of having a small cell area, and low cost per bit. Such advantage is the result of having a cell structure with a reduced area occupied by a contact per bit.

In various aspects, the memory device of the non-volatile memory device can be included in a flat panel display device, such as an organic light emitting display (OLED) device.

Figure 5:
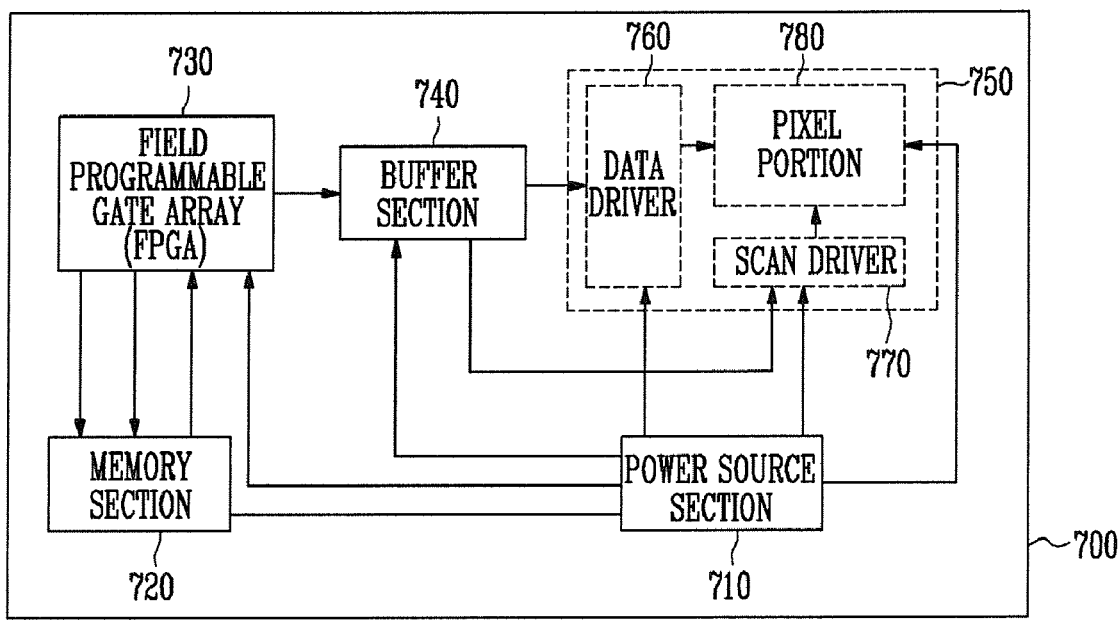
FIG. 5 is a block diagram showing a flat panel display device according to an aspect of the present invention.

FIG. 5 is a block diagram showing the constitution of a flat panel display device according to an aspect of the present invention. In FIG. 5, although an organic light emitting display device is shown among the flat panel display devices as an example, the type of flat panel display device according to aspects of the present invention is not limited to simply the organic light emitting display device.

Referring to FIG. 5, the organic light emitting display device 700 includes a power source section 710, a memory section 720, a program section 730 (or a field programmable gate array (FPGA)), a buffer section 740, and a panel section 750. In the non-limiting aspect shown, the power source section 710 receives power from a power source (not shown), steps down the power, divides the power, and transfers the power source voltage to various built-in circuit sections thereof.

Namely, the power source section 710 is designed so as to vary the power voltage and transfer the power voltage to the various built circuit sections, i.e., the memory section 720, the field programmable gate array 730, the buffer section 740, and/or a panel section 750.

As stated above, the built-in circuit sections is the general term for the memory section 720, the field programmable gate array 730, the buffer section 740, the panel section 750, as well as the power source section 710.

In the aspect shown, the memory section 720 may be implemented by the non-volatile memory device which has been explained with references to FIGS. 3 and 4, and a memory device constituting the memory section 720 may be the non-volatile memory device according to the aspect of the present invention as explained with reference to FIGS. 1A to 1H.

Accordingly, as the data processing speed of the memory section 720 has continuously been becoming faster of late, the data stored in the memory section 720 is promptly transferred to the program section 730 in various aspects.

The field programmable gate array 730 receives data from the memory section 720 according to the transplanted (or recognized) program logic and transfers a command signal and an address signal to the memory section 720. Namely, the memory section 720 designates the address of the memory section 720 according to the command signal and the address signal, and outputs data corresponding to the address to the field programmable gate array 730. Therefore, the data received in the field programmable gate array 730 are converted to a program signal and a control signal by the program logic, and are transferred to the buffer section 740.

In the aspect shown, the control signal controls the program signal operating an organic light emitting device (not shown) of the panel section 750.

In the aspect shown, the buffer section 740 is a memory place to store information temporarily and is a unit used to compensate for the difference of time and the difference of information flow speeds generated when information is transmitted from one unit to another unit.

In the aspect shown, the panel section 750 includes a data driving section 760, a scan driving section 770, and a pixel section (or portion) 780, and the pixel section 780 includes the organic light emitting device.

In the aspect shown, the panel section 750 receives the program signal and the control signal from the buffer section 740, and the organic light emitting device self-emits light.

As discussed above, reduced excessive leakage of current at a rough surface of a polysilicon layer (generated by irradiation of a laser on an amorphous silicon layer) and improved blocking function can be realized even by a thickness of a blocking film thinner than a related art oxide film, by forming a second insulator of an oxy-nitride ($SiO_xN_y$) layer using nitrous oxide ($N_2O$) plasma to miniaturize the non-volatile memory device formed on a glass substrate.

In the various aspects, the non-volatile memory device according to an aspect of the present invention can be applied to a flat panel display device, such as an organic light emitting display device, by forming the non-volatile memory device on the glass substrate without using a high temperature process.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. A non-volatile memory device, comprising:
   a buffer oxide film;
   a polysilicon layer on the buffer oxide film;
   a first insulator including a first silicon oxy-nitride ($SiO_xN_y$) layer disposed directly on the polysilicon layer and a first silicon dioxide ($SiO_2$) layer on the first $SiO_xN_y$ layer in which a concentration of nitrogen in the first $SiO_xN_y$ layer is highest in a portion of the first $SiO_xN_y$ layer closest to the polysilicon layer and lowest in a portion of the first $SiO_xN_y$ layer farthest away from the polysilicon layer;
   a nitride film on the first insulator;
   a second insulator including a second silicon oxy-nitride ($SiO_xN_y$) layer on the nitride film and a second silicon dioxide ($SiO_2$) layer on the second $SiO_xN_y$ layer;
   a gate electrode on the second insulator; and
   a source/drain in the polysilicon layer.

2. The non-volatile memory device as claimed in claim 1, wherein the first and second $SiO_xN_y$ layers are formed to have varying degrees of nitrogen content.

3. The non-volatile memory device as claimed in claim 1, wherein the first $SiO_xN_y$ layer is approximately 10 to 20 Å thick.

4. The non-volatile memory device as claimed in claim 1, wherein the first $SiO_2$ layer is approximately 10 to 25 Å thick.

5. The non-volatile memory device as claimed in claim 1, wherein the nitride film is approximately 50 to 350 Å thick.

6. The non-volatile memory device as claimed in claim 1, wherein the second $SiO_xN_y$ layer is approximately 50 Å thick and the second $SiO_2$ layer is approximately 30 Å thick.

7. The non-volatile memory device as claimed in claim 1, wherein the concentration of nitrogen decreases throughout the first $SiO_xN_y$ layer according to a gradient.

8. The non-volatile memory device as claimed in claim 1, wherein a concentration of nitrogen in the second $SiO_xN_y$ is highest in a portion of the second $SiO_xN_y$ layer closest to the nitride layer and lowest in a portion of the second $SiO_xN_y$ layer farthest away from the nitride layer.

9. The non-volatile memory device as claimed in claim 8, wherein the concentration of nitrogen decreases throughout the second $SiO_xN_y$ layer according to a gradient.

10. The non-volatile memory device as claimed in claim 1, wherein a surface of the polysilicon layer on which the first insulator is disposed is rough.

11. A non-volatile memory apparatus including a field region defining an active region, a word line crossing the active region and the field region, and a non-volatile memory device formed at a cross region of the word line and the active region, wherein the non-volatile memory device comprises:
    a buffer oxide film;
    a polysilicon layer on the buffer oxide film;
    a first insulator including a first silicon oxy-nitride ($SiO_xN_y$) layer disposed directly on the polysilicon layer and a first silicon dioxide (SiO2) layer on the first SiOxNy layer in which a concentration of nitrogen in the first $SiO_xN_y$ layer is highest in a portion of the first $SiO_xN_y$ layer closest to the polysilicon layer and lowest in a portion of the first $SiO_xN_y$ layer farthest away from the polysilicon layer;
    a nitride film on the first insulator;
    a second insulator including a second silicon oxy-nitride ($SiO_xN_y$) layer on the nitride film and a second silicon dioxide ($SiO_2$) layer on the second $SiO_xN_y$ layer;
    a gate electrode on the second insulator; and
    a source and a drain formed in the polysilicon layer by injecting impurity ions into respective exposed regions of the polysilicon layer.

12. The non-volatile memory apparatus as claimed in claim 11, wherein the first $SiO_xN_y$ layer and the first $SiO_2$ layer are formed using a nitrous oxide plasma in an inductively coupled plasma chemical vapor deposition (CVD) apparatus.

13. The non-volatile memory apparatus as claimed in claim 11, wherein the non-volatile memory apparatus is a NAND device or a NOR device.

14. A flat panel display device including a power source section, a memory section, a program section, a buffer section, and a panel section, wherein the memory section include a non-volatile memory device comprising:
    a buffer oxide film;
    a polysilicon layer on the buffer oxide film;
    a first insulator including a first silicon oxy-nitride ($SiO_xN_y$) layer disposed directly on the polysilicon layer and a first silicon dioxide ($SiO_2$) layer on the first $SiO_xN_y$ layer in which a concentration of nitrogen in the first silicon (SiOxNy) layer is highest in a portion of the first SiOxNy layer closest to the polysilicon layer and lowest in a portion of the first $SiO_xN_y$ layer farthest away from the polysilicon layer;
    a nitride film on the first insulator;
    a second insulator including a second silicon oxy-nitride ($SiO_xN_y$) layer on the nitride film and a second silicon dioxide ($SiO_2$) layer on the second $SiO_xN_y$ layer;
    a gate electrode on the second insulator; and
    a source and a drain formed in the polysilicon layer by injecting impurity ions into respective exposed regions of the polysilicon layer.

15. The flat panel display device as claimed in claim 14, wherein the first $SiO_xN_y$ layer and the first $SiO_2$ layer are formed using a nitrous oxide plasma in an inductively coupled plasma chemical vapor deposition (CVD) apparatus.

16. The flat panel display device as claimed in claim 14, wherein the flat panel display device is an organic light emitting display device.

* * * * *

UNITED STATES PATENT AND TRADEMARK OFFICE
CERTIFICATE OF CORRECTION

Page 1 of 1

PATENT NO.        : 7,880,220 B2
APPLICATION NO.   : 11/777613
DATED             : February 1, 2011
INVENTOR(S)       : Byoung Deog Choi It is certified that error appears in the above-identified patent and that said Letters Patent is hereby corrected as shown below:

On the Title Page
None

In the Claims

Column 11, Claim 8, line 18          Delete "$SiO_xN_y$"
                                      Insert -- $SiO_xN_y$ layer --

Column 11, Claim 11, line 37         Delete "SiO2"
                                      Insert -- $(SiO_2)$ --

Column 11, Claim 11, line 38         Delete "SiOxNy"
                                      Insert -- $SiO_xN_y$ --

Column 12, Claim 14, lines 24-25     Delete "first silicon (SiOxNy)"
                                      Insert -- first $SiO_xN_y$ --

Column 12, Claim 14, line 26         Delete "SiOxNy"
                                      Insert -- $SiO_xN_y$ --

Signed and Sealed this
Nineteenth Day of June, 2012

David J. Kappos
*Director of the United States Patent and Trademark Office*